(12) United States Patent
Henrici et al.

(10) Patent No.: US 10,651,515 B2
(45) Date of Patent: May 12, 2020

(54) BATTERY SENSOR DATA TRANSMISSION UNIT AND A METHOD FOR TRANSMITTING BATTERY SENSOR DATA

(71) Applicant: Robert Bosch GmbH, Stuttgart (DE)

(72) Inventors: Fabian Henrici, Stuttgart (DE); Axel Wenzler, Reutlingen (DE); Werner Schiemann, Fellbach (DE); Reiner Schnitzer, Reutlingen (DE); Berthold Elbracht, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 716 days.

(21) Appl. No.: 14/379,115

(22) PCT Filed: Jan. 23, 2013

(86) PCT No.: PCT/EP2013/051221
§ 371 (c)(1),
(2) Date: Aug. 15, 2014

(87) PCT Pub. No.: WO2013/124110
PCT Pub. Date: Aug. 29, 2013

(65) Prior Publication Data
US 2015/0010790 A1    Jan. 8, 2015

(30) Foreign Application Priority Data

Feb. 23, 2012    (DE) .................... 10 2012 202 751

(51) Int. Cl.
*H01M 10/42*    (2006.01)
*H04Q 9/00*    (2006.01)
(Continued)

(52) U.S. Cl.
CPC ......... *H01M 10/425* (2013.01); *H01M 10/48* (2013.01); *H04Q 9/00* (2013.01);
(Continued)

(58) Field of Classification Search
CPC .............. H01M 10/425; H01M 10/48; H01M 2010/4278; H01M 2220/20; G01R 31/371; H04Q 2209/84; H04Q 9/00
See application file for complete search history.

(56) References Cited

U.S. PATENT DOCUMENTS

2006/0250233 A1* 11/2006 Powell ............... G01R 31/3606
340/539.1
2011/0014501 A1* 1/2011 Scheucher ............... B60K 1/04
429/7
(Continued)

FOREIGN PATENT DOCUMENTS

CN       1195325 A    10/1998
CN     102150057 A     8/2011
(Continued)

OTHER PUBLICATIONS

International Search Report for PCT/EP2013/051221, dated Jun. 5, 2013.

*Primary Examiner* — Miriam Stagg
*Assistant Examiner* — Lilia Nedialkova
(74) *Attorney, Agent, or Firm* — Norton Rose Fulbright US LLP; Gerard Messina

(57) ABSTRACT

A battery sensor data transmission unit is described as including a data transmission unit, which is designed to output a sensor signal, which represents a physical variable in or at the battery cell to an evaluation device, using a battery housing wall and/or a wall of a battery cell as the transmission medium.

7 Claims, 2 Drawing Sheets

(51) Int. Cl.
*H01M 10/48* (2006.01)
*G01R 31/371* (2019.01)

(52) U.S. Cl.
CPC ... *G01R 31/371* (2019.01); *H01M 2010/4278* (2013.01); *H01M 2220/20* (2013.01); *H04Q 2209/84* (2013.01)

(56) References Cited

U.S. PATENT DOCUMENTS

| | | | |
|---|---|---|---|
| 2011/0039137 A1* | 2/2011 | Engle | H01M 10/425 |
| | | | 429/90 |
| 2011/0186365 A1* | 8/2011 | Abadia | B60L 3/0046 |
| | | | 180/65.1 |

FOREIGN PATENT DOCUMENTS

| | | |
|---|---|---|
| CN | 104115508 A | 10/2014 |
| DE | 102 58 075 | 6/2004 |
| DE | 10 2009 036 086 | 2/2011 |
| GB | 2424318 | 9/2006 |

* cited by examiner

BATTERY SENSOR DATA TRANSMISSION UNIT AND A METHOD FOR TRANSMITTING BATTERY SENSOR DATA

FIELD OF THE INVENTION

The present invention relates to a battery sensor data transmission unit, a method for transmitting battery sensor data, as well as an appropriate computer program product.

BACKGROUND INFORMATION

In particular in automotive engineering, batteries are increasingly being used to make it possible to operate an electric motor as a means of moving the vehicles. In this context, monitoring the state of the batteries is increasingly important in order to communicate to a user of the vehicle a possibly upcoming problem with the drive unit or a possible battery failure at an early state. For this purpose it was provided to carry out a detection and transmission of sensor signals over dedicated data lines, for example, the CAN Bus. Relevant data about a state of the battery are detected by one or multiple battery sensors and transmitted to a control unit or evaluation device.

German Published Patent Application No. 10 2009 036 086 describes a monitoring electronic system for a battery having a plurality of cells, the monitoring electronic system having a plurality of cell monitoring circuits which are attached to a flexible circuit board. In particular, the monitoring electronic system may be set up in such a way that it includes a cell monitoring circuit for each cell pole of the battery. In particular, the provision of preferably many integrally bonded connections between an electronic system and the flexible circuit board and/or the flexible circuit board including the cells and optional temperature sensors may result in a longer service life with lower error rates.

SUMMARY

Against this background, the present invention relates to a battery sensor data transmission unit, a method for transmitting battery sensor data, as well as an appropriate computer program product.

The present invention provides a battery sensor data transmission unit including the following feature:
- a data transmission unit which is implemented to output a sensor signal representing a physical variable in or at the battery cell, using a battery housing wall and/or a wall of a battery cell as the transmission medium to an evaluation device.

A (battery sensor data transmission) unit may be understood in the present case as a device or an electric device which processes sensor signals and as a function of those sensor signals outputs control and/or data signals. The device may include an interface which may be designed as hardware and/or software. In a hardware design, the interfaces may, for example, be part of a so-called system ASIC, which includes various functions of the device. However, it is also possible that the interfaces are separate integrated circuits or are made, at least in part, of discrete components. In a software design, the interfaces may be software modules, which, for example, are present on a microcontroller together with other software modules.

A data transmission unit may be understood as a device or a module used to process a sensor signal and to transmit that signal via a predetermined transmission path to an evaluation device. A sensor signal may be understood to be a signal, which represents a physical variable, for example, a pressure or a temperature in or at the respective battery cell.

A battery cell may, for example, be understood to be a sub-area of a larger energy store in the form of a battery or an accumulator and a battery housing wall may be understood to be a container wall, this container containing one or multiple battery cells. An evaluation device may be understood to be a device which may, for example, be designed as an electronic device for the execution of electronic control commands or for data processing. The evaluation device may, for example, be designed in the form of an electronic circuit or of an integrated circuit.

The present invention is based on the finding that for energy storing units such as a battery, a housing is often used, which is, for example, electrically conductive and thus may be used to transmit data such as the sensor signal. In order to avoid material and labor effort for providing an additional data line for the transmission of the sensor signal in such a battery unit, a transmission unit for battery sensor data or an appropriate method for the transmission of battery sensor data may be provided, which transmits the sensor signal via the housing wall, which may usually be used for signal transmission. In this way, manufacturing costs for such a battery unit or a battery sensor data transmission unit are advantageously reduced, an available construction area being used optimally at the same time.

Furthermore, the present invention also provides a method for the transmission of battery sensor data, the method including the following step:
- outputting a sensor signal, which represents a physical variable in or at the battery cell, to an evaluation device using a battery housing wall and/or a wall of a battery cell as the transmission medium.

By using such a specific embodiment of the present invention the previously mentioned advantages are also achieved.

Also advantageous is a computer program product having program code, which may be stored on a machine-readable medium, such as a semiconductor memory, a hard disk memory, or an optical memory, and is used for carrying out the method according to one of the previously described specific embodiments, if the program is executed on a unit, a computer, or a device.

According to one specific embodiment of the present invention, the data transmission unit may be designed to transmit the sensor signal to the battery housing wall using a capacitive coupling or an inductive coupling between a battery cell and the battery housing wall. Such a specific embodiment of the present invention has the advantage that the battery sensor data transmission unit may be electrically insulated from a battery housing wall, which makes it possible for a signal to be transmitted even when there are differences in potential levels between the battery sensor data transmission unit and the battery housing wall, or the wall of the battery cell. This makes a signal transmission possible which is significantly less susceptible to malfunctions.

According to another specific embodiment of the present invention, the data transmission unit may be designed to transmit the sensor signal to the battery housing wall using an electrically conductive connection. Such a specific embodiment of the present invention has the advantage that electrical signals are transmitted reliably from the battery sensor data transmission unit to the evaluation device.

Furthermore, the data transmission unit may also be designed according to the specific embodiment of the present invention to transmit the sensor signal using a code unambiguously assignable to the battery cell. For example, each sensor signal may be encoded using a different code. Such a specific embodiment of the present invention has the advantage that, when the sensor signal of multiple battery cells is transmitted to the evaluation device via a shared battery housing wall, the sensor signal of each individual battery sensor data transmission unit in the different battery cells may be extracted reliably.

Furthermore, according to another specific embodiment of the present invention, a connection state ascertainment unit is provided in order to ascertain the state of a series connection in which one battery cell is connected in series to a second battery cell with the aid of a power transmission line and/or in order to determine a bypassing state, in which at least one pole of the battery cell is not connected in series to at least one other battery cell, the data transmission unit being designed to output the sensor signal in the bypassing state to an evaluation device by using a battery housing wall as the transmission medium.

Accordingly, according to another specific embodiment of the present invention a method is provided for the transmission of battery sensor data, the method including the following steps:

ascertaining a series connection state in which one battery cell is connected in series to at least one other battery cell with the aid of a power transmission line and/or ascertaining a bypassing state in which the pole of one battery cell is decoupled from at least one other battery cell; and outputting a sensor signal, which represents a physical variable in or at the battery cell, in the series connection state to an evaluation device using the power transmission line and/or outputting the sensor signal in the bypassing state to the evaluation device using a battery housing wall as the transmission medium.

A connection state ascertainment unit may be understood as a device or a module which is designed to determine a series connection state and/or a bypassing state in an electrical coupling (or decoupling) of multiple battery cells. A power transmission line may be understood to be an electrical line via which in addition to a current flow for the transmission of electrical energy, a data signal may be modulated. A series connection state may be understood to be a state in which a pole of one battery cell is connected in series to at least one pole of one other battery cell in an electrically conductive way as a power transmission line. In the series connection state, the battery cell may be understood to be connected in series to at least one other battery cell so that at two end tapping terminals of such a series connection the voltages at the respective poles of the two battery cells connected in series are summed up. A bypassing state may be understood to be a state in which the pole of the battery cell is not connected to another pole of one other battery cell, i.e., the pole of the battery cell is decoupled from another pole of one other battery cell. If, on the other hand, multiple other battery cells are connected in series without the battery cell in question being included in the series connection, the connection state ascertainment unit determines the transmission state in which the battery cell in question is connected electrically only in a side branch of the power transmission line. In such a transmission state, the voltage between the two poles of the battery cell in question is not usable to increase the voltage between the end tapping terminals. This predetermined transmission path may be chosen as a function of the particular series connection state or the bypassing state of the data transmission unit. In the series connection state, the sensor signal may be transmitted directly via the power transmission line. In this case, the sensor signal may be transmitted to the evaluation device using a powerline transmission method without using an additional data line. In the bypassing state, in which at least one pole of the battery cell in question is not integrated into and connected to the power transmission line (i.e., in which the pole of the battery cell is decoupled from another pole of one other battery cell) the sensor signal may be transmitted to the evaluation device using the battery housing wall. In this case, this battery housing wall may be used as an element in order to establish an electrical line to the evaluation device through the side branch in which the battery cell in question is electrically located in the transmission state.

These specific embodiments are based on the finding that, when the individual battery cells are connected differently in order to provide different voltage levels, data may be transmitted via the same line which is also used by the individual battery cells to transfer electrical energy. Such an approach has the advantage that a separate data transmission line is not necessary, whereby manufacturing costs for a battery sensor data transmission unit may be reduced and, at the same time, a lower error rate through a smaller number of components may be ensured. If, however, a battery cell is decoupled from this series connection, it would no longer be possible to transmit the sensor data representing a physical variable of this specific decoupled battery to the evaluation device. In such a case, the battery cell in question, which is partly decoupled from the power transmission line, may be connected to a "separate" circuit, which is closed via a battery housing wall, thus enabling in this way the transmission of the sensor signal in the transmission state to the evaluation device. In this simple and reliable way, a continuous and largely interruption-free evaluation of one or multiple physical variable(s) contained in one or multiple sensor signals is made possible.

According to one advantageous specific embodiment of the present invention the connection state ascertainment unit may be designed to determine the series connection state when poles of at least three battery cells are connected in series using the power transmission line. Such a specific embodiment of the present invention has the advantage that a power transmission line may be set up, via which different voltage levels are achievable at the tapping terminals of the power transmission line, for example, by multiplexing different combinations of a connection of the individual battery cells. In such a flexibly connectable power transmission line there is a particularly high need for a reliable and stable transmission of data signals via this power transmission line even when individual battery cells are decoupled from the series connection of this power transmission line.

According to another specific embodiment of the present invention, the connection state ascertainment unit may also be designed to determine the series connection state or the bypassing state by evaluating the position of a switch which is designed to carry out an electrical coupling of the pole of the battery cell to the power transmission line. Such a switch may, for example, be a multiplexer, which connects the poles in question of individual battery cells in different ways. Such a specific embodiment of the present invention has the advantage that predefined switch positions may be evaluated and allows a conclusion to be drawn as to whether a particular battery cell is presently integrated into a series connection of a power transmission line. In this way, the bypassing state or the series connection state of a certain battery cell may be ascertained very quickly and in a technical manner.

According to one specific embodiment of the present invention the connection state ascertainment unit may be designed to ascertain the series connection state or the bypassing state using a measuring result in relation to a current flow, energy flow and/or power flow via the power supply line. Such a specific embodiment of the present invention has the advantage of a technically simple detection of whether the battery cell, which is coupled to the battery sensor data transmission unit, is connected in series to other battery cells so that power is transmitted via the power supply line.

In one specific embodiment of the battery sensor data transmission unit according to the present invention, in which the switch is activated using a control signal, in particular using a pulse-width modulated control signal, the data transmission unit may be advantageously designed to synchronize the ascertainment or output of the sensor signal with the control signal. Such a specific embodiment of the present invention has the advantage that by evaluating the previously known pulse-width modulated control signal, a conclusion may be drawn regarding the instantaneously present series connection state or the bypassing state for a battery cell in question without requiring a measurement or a determination of the instantaneous connection state. By synchronizing the output or the ascertainment of the sensor signal with the control signal, a fast and virtually interruption-free transmission of the sensor signal to the evaluation device is possible.

Particularly advantageous is one specific embodiment of the present invention in which the data transmission unit is designed not to output the sensor signal to an evaluation device in the bypassing state using the power transmission line and/or not to output the sensor signal 168 to the evaluation device in the series connection state using a battery housing wall as the transmission medium. Such a specific embodiment of the present invention has the advantage that it is ensured that the battery housing wall is used as the transmission medium for a sensor signal from a specific battery cell to the evaluation device only in the bypassing state. This enables a simpler evaluation or a simpler reception of the sensor signals at the evaluation device, since the evaluation device needs to expect at predetermined points in time sensor signal 168 of a particular battery cell via a single transmission path only. At the same time, it is ensured that the power transmission line is preferably frequently used to transmit the sensor signal, in this way minimizing interferences.

To ensure that data signals are unambiguously assigned in the evaluation device, according to one specific embodiment of the present invention the data transmission unit may be designed to encode the sensor signal in a sensor signal package unambiguously assignable to the battery cell. Such a specific embodiment of the present invention has the advantage that multiple sensor signals representing physical variables from different battery cells may be unambiguously assigned to the battery cell in question in the evaluation device.

Furthermore, it is advantageous when according to another specific embodiment of the present invention a battery unit is provided having the following features:
- a battery cell assembly which includes at least two battery cells, the battery cells being connectable in series with the aid of a power transmission line;
- at least one sensor which provides a measured value, the measured value representing a physical variable in or at one of the battery cells; and
- at least one battery sensor data transmission unit according to a previously described variant.

Such a specific embodiment of the present invention has the advantage that the individual components may be optimally coordinated so that a preferably interference-free transmission of sensor signal 168 to an evaluation unit or an evaluation device may be carried out.

DETAILED DESCRIPTION

Figure 1:
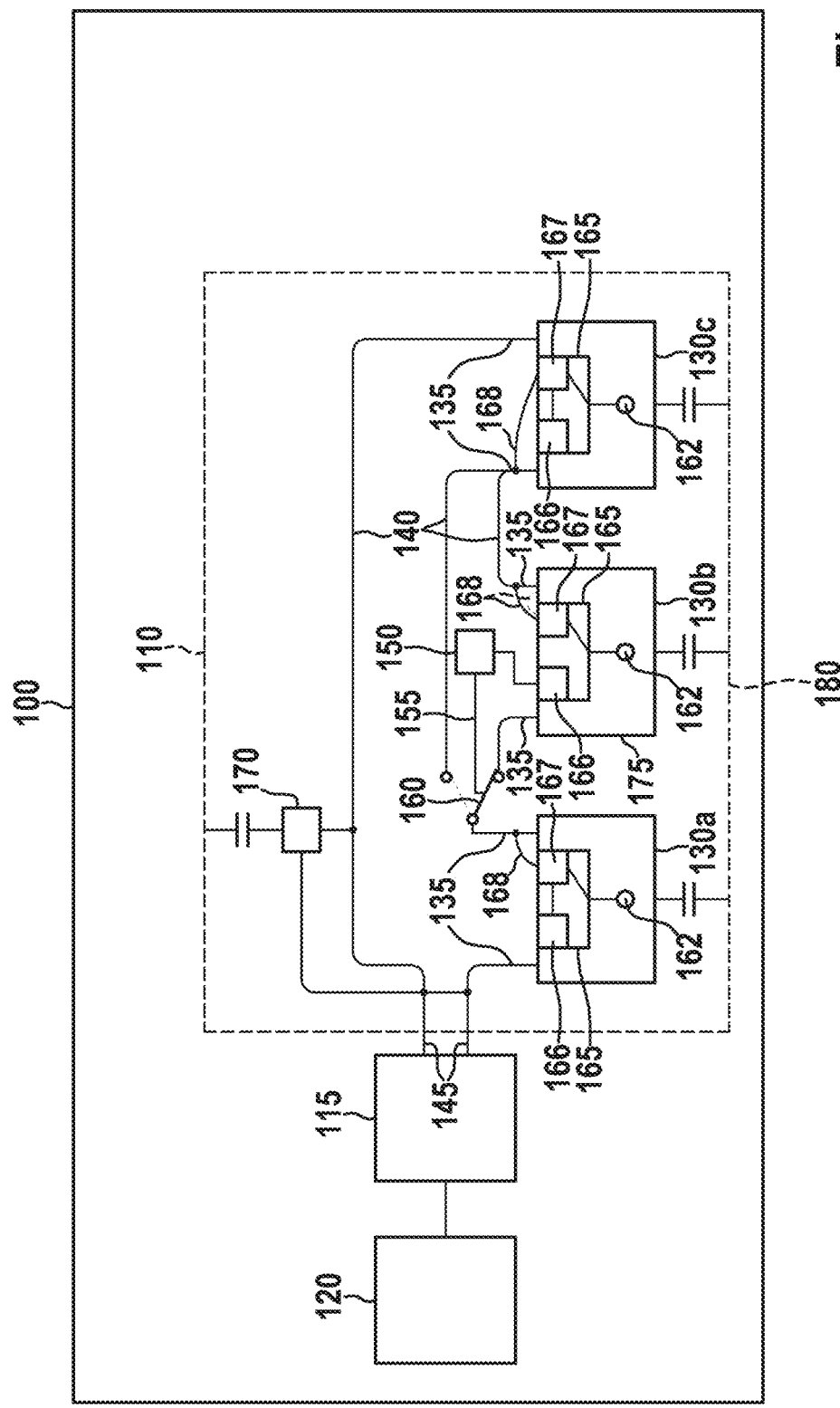
FIG. 1 shows a block diagram of a battery unit in which one exemplary embodiment of the present invention is used.

In the following description of preferred exemplary embodiments of the present invention the same or similar reference numerals are used for similar elements in the different figures, a repeated description of those elements being omitted.

FIG. 1 shows a block diagram of a vehicle 100 including a battery unit 110 for providing electrical power to a power electronics unit 115, an electric motor 120 being operatable by the power supplied by battery unit 110. In battery unit 110, multiple battery cells 130 are situated, which are denoted by reference numerals 130a, 130b and 130c for better differentiation. In the exemplary embodiment of FIG. 1, all battery cells 130 are configured identically, which is not always absolutely necessary. Poles 135 of battery cell 130 are connected in series to each other in power transmission line 140 so that, in the connection state shown in FIG. 1 with a solid line, voltage is available to battery unit 110 at tapping terminals 145, which in sum equals the voltages between poles 135 of each of the three shown battery cells 130. In order to supply alternating voltage or at least a varying voltage level at terminals 145, the connection state of individual battery cells 130 may be controlled with the aid of connection control unit 150. In a very simple case shown in FIG. 1 intended to show only the operating mode in principle of such a change of the connection state, a switch 160 may be activated by connection control unit 150 using a control signal 155 in such a way that this switch is brought from a position shown with a solid line in FIG. 1 to a position shown with a broken line in FIG. 1, whereby middle battery cell 130b shown in FIG. 1 is decoupled from the series connection of power transmission line 140. If, however, poles 135 of middle battery cell 130b and right battery cell 130c (for example, for reasons of a preferably error-resistant circuit configuration) middle battery cell 130b is connected as a side branch of power supply line 140 which is not relevant for the supply of the voltage level at terminals 145. In this state, in which the middle battery cell 130b is decoupled from the series connection, this battery cell is in a state which in the following description is referred to as bypassing state. If, however, switch 160 is in the position shown with a solid line in FIG. 1, the middle battery cell 130b shown in FIG. 1 is in a state which in the following description is referred to as series connection state.

All battery cells 130 shown in FIG. 1 each include one battery sensor data transmission unit 165. Battery sensor data transmission unit 165 includes one connection state ascertainment unit 166 and one data transmission unit 167 coupled to connection state ascertainment unit 166. The circuit state ascertainment unit 166 is designed to ascertain a connection state of battery cell 130 in question (i.e., for example, the series connection state or bypassing state), for example by measuring the current flowing over the poles of battery cell 130 or the energy/power flowing over same. Data transmission unit 167 is designed to convert a physical variable detected by a sensor 162 into a sensor signal 168 and to transmit this sensor signal to an evaluation device 170. The physical variable detected by sensor 162 in question may, for example, be a pressure or a temperature in or at battery cells 130a, 130b or 130c in question. In evaluation device 170, the state of the individual battery cells 130 may be monitored and, when a deviating physical variable is detected in or at one of battery cells 130, a warning or a handling recommendation may be output to a user of battery unit 110.

In the series connection state, battery sensor data transmission unit 165 may modulate sensor signal 168 of battery cells 130 in question as a powerline signal transmission in addition to the energy flowing in power supply line 140 so that evaluation device 170 is able to filter out and evaluate the sensor signals of power supply line 140. If, however, middle battery cell 130b shown in FIG. 1 is switched to the transmission state by switching switch 160 in order to provide a changing voltage level at terminals 145 with technically simple means, there is no longer a closed circuit between battery sensor data transmission unit 165, middle battery cell 130b and evaluation device 170. A sensor signal including a physical variable pertaining to middle battery cell 130b could then no longer be transmitted to evaluation device 170.

In order to nonetheless ensure a transmission of the sensor signal from battery sensor data transmission unit 165 of middle battery cell 130b, at a point in time when the battery cell in question is decoupled from power supply line 140 or when it is at least no longer connected in series to other battery cells 130, battery sensor data transmission unit 165 of middle battery cell 130b may close a high-frequency electrical circuit with evaluation device 170. This may, for example, be achieved by establishing a connection which is capable of transmitting data under certain circumstances (for example, as a capacitive coupling) to evaluation device 170 via a wall 175 of middle battery cell 130b and/or a battery unit housing wall 180, evaluation device 170 also being connected to battery unit housing wall 180 via a connection which is also capable of transmitting data under certain circumstances (for example, also as a capacitive coupling). A wall of battery cell 130 and/or of battery unit 110 may be understood to be an exterior wall which is different from a pole (or is electrically insulated from such a pole), this pole being intended specifically for electrical contacting of battery cell 130 and/or of battery unit 110. Alternatively, there may also be a continuous electrically conductive connection between battery sensor data transmission unit 165 and evaluation device 170. In this case, the transmission of the sensor signal to battery cell wall 175 or to battery unit housing wall 180 is shown in FIG. 1 as a broken feed-in of sensor signal 168 to battery cell wall 175. Now, even without a current path between battery sensor data transmission unit 165 and evaluation device 170 there is the option of transmitting sensor signal 168 from middle battery cell 130b to evaluation device 170, since a path is now established, for example, via the capacitive coupling between battery cell wall 175 and battery housing wall 180, as well as between the capacitive coupling between the battery housing wall and evaluation device 170, at least for high-frequency signals. Alternatively to or in addition to the transmission of sensor signal 168 via power supply line 140, sensor signal 168 may also be completely transmitted from respective battery cell 130b (i.e., not only in the bypassing state) using wall 180 of battery unit 110. In particular in a case in which many or all battery cells 130 of battery unit 110 are connected in a fixed manner, this means statically, and not separably during operation, a transmission of the sensor signals from individual battery cells 130 or corresponding battery sensor transmission units 165 may be achieved very easily in such a way. For this purpose, the sensor signal may, for example, be encoded by battery sensor data transmission unit 165 or each sensor signal of one of the battery censor data transmission units being used, which enables the encoded sensor signal to be unambiguously assigned to respective battery sensor data transmission unit 165 which emits the encoded sensor signal. This encoding may, for example, take place in the form of a code-multiplex-encoding method in which an individual code is assigned to each of battery sensor data transmission units 165 in individual battery cells 130, this code being distinguishable from other codes.

In such an embodiment, it could, on the one hand, be ensured that each battery sensor data transmission unit 165 is capable of transmitting a corresponding sensor signal 168 to the evaluation unit or evaluation device 170, and, at the same time, the determination of the connection state of the battery cell in question in the series connection state or the bypassing state may be avoided. On the other hand, such a transmission of information via a housing wall 180 of battery unit 110 may possibly be more susceptible to interferences than the transmission of information via power supply line 140. It is also conceivable, for example, that a hybrid form of data transmission takes place using the two methods mentioned above, for example, in that state information about the general operational readiness of individual battery sensor data transmission unit 165 via a wall 180 of the battery unit 110 to evaluation device 170, whereas the sensor signals, which each represent a physical variable within battery cell 130 in question, are transmitted via power supply line 140. In this case, for example, the information transmitted via power supply line 140 could be reduced, whereas data, which do not require an update rate this high, are transmitted to evaluation device 170 via an alternative transmission path, which is wall 180 of battery unit 110.

In order to switch particularly quickly and effectively between the transmission of the sensor signal from middle battery cell 130b to the evaluation device, the output of the sensor signal of middle battery cell 130b may be synchronized on the one hand to the power supply line 140 and on the other hand to battery cell wall 175. For this purpose, the battery sensor data transmission unit may receive a signal from connection control unit 150 representing a switchover of switch 160 so that battery sensor data transmission unit 165 may detect very early and without, for example, measuring a flow of power via power supply line 140, that it was switched to the bypassing state. In this way, it may be ensured that the sensor signal is transmitted to evaluation device 170 nearly interruption-free, or that the data transmission is at least only briefly interrupted.

Figure 2:
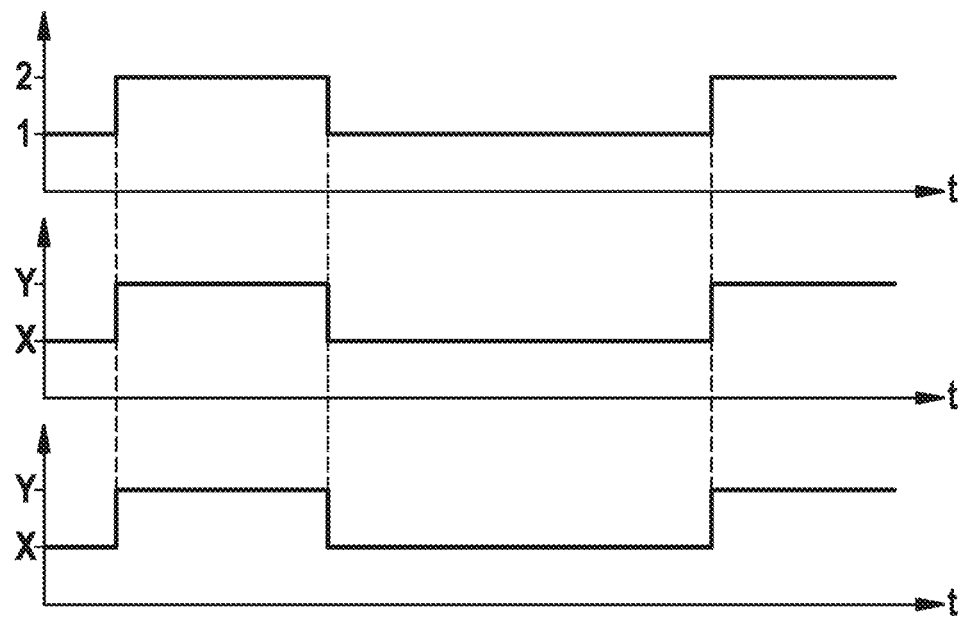
FIG. 2 shows diagrams showing a synchronization of a switch signal for a switch having one output of the sensor signal.

FIG. 2 shows in the upper partial diagram a progression of positions 1 (in FIG. 1 shown with a solid line) and 2 (in FIG. 1 shown with a broken line) of switch 160 as it is activated by connection control unit 150. The middle diagram shows a change over time between series connection X and bypassing Y of middle battery cell 130b. Here it is apparent that a very simple and stable transmission of the sensor signal from middle battery cell 130*b* to evaluation device 170 may be ensured by synchronizing the position of switch 160 and the switch to a particular path for the transmission of the sensor signal required by the connection state of middle battery 130*b* according to the lower partial diagram of FIG. 2 (x stands for the transmission of the sensor signal via power supply line 140, y stands for the transmission of the sensor signal via the ground connection.)

In FIG. 1, to better illustrate the basics of the approach presented here, the explanation of the basic idea of an exemplary embodiment of the present invention has been limited to the bypassing of only one battery cell 130. The connection or bypassing option shown in FIG. 1 may, of course, also be extended to any desired number of individual battery cells 130 or extended to bypassing multiple battery cells 130 at the same time, the concept presented above being adjustable easily to the individual case used. Bypassing states that differ in length of time may also be specified for individual battery cells 130 in order to obtain the desired voltage at terminals 145. For this purpose, switch or switches 160 of connection control unit 150 may (each) be activated by a pulse-width-modulated signal so that the desired sequence of series connection states and bypassing states for the individual battery cells may be implemented.

Figure 3:
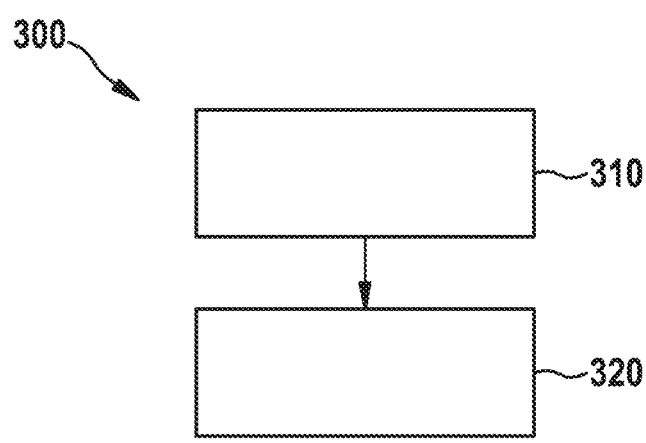
FIG. 3 shows a flow chart of one exemplary embodiment of the present invention as a method.

FIG. 3 shows a flow chart of one exemplary embodiment of the present invention as method 300 for the transmission of battery sensor data. The method includes a step of determining 310 a series connection state in which one pole of a battery cell is connected in series to one pole of at least one other battery cell with the aid of a power transmission line, and/or determining a bypassing state in which the pole of the battery cell is not connected in series to the pole of the at least one other battery cell. Method 300 also includes a step of outputting 320 a sensor signal, which represents a physical variable in or at the battery cell, in the series connection state to an evaluation device, using the power transmission line, and/or outputting the sensor signal in the bypassing state to the evaluation device by using a battery housing wall and/or a wall of a battery cell as the transmission medium. Specifically, however, according to one exemplary embodiment of the present invention, the method may include a step of outputting 320 a sensor signal, which represents a physical variable in or at the battery cell, the output to the evaluation device taking place using the battery housing wall and/or a wall of a battery cell as the transmission medium.

In summary, it should be noted that for the implementation of the present invention one specific embodiment of a battery may be used, in which a change in the battery voltage caused by an interconnection of different battery cells may be enabled, it being possible in the basic state that all battery cells 130, for example, are connected in series. In order to generate an alternating voltage at the output of battery 110, modules, i.e., battery cells 130 or groups of those battery cells (logic and circuitry-wise grouping of multiple cells within the battery), are bypassed in this series connection. In this way, the output voltage of battery 110 may be varied as a sum of the non-bypassed modules.

One aspect of the approach presented here includes enabling the communication on the part of a sensor system 165, 162 within a battery having a variable output voltage 110, while individual battery cells are decoupled or bypassed from power supply line 140 due to the operating mode of the battery. In bypassed module 130*b* at least one of its terminals 135 is decoupled by a power switch 160. At the same time, terminals 135 are bypassed on the battery level in order to maintain the series connection of the remaining modules 130*a* and 130*c*. In this way, module 130*b* forms a side-branch with a dead end in power supply line 140 and a powerline communication is no longer possible.

The previously presented aspect in particular intends to the limitation of a communication via powerline to the phases in which the data transmitting cell 130 does not depend on the rest of power supply line 140. This may take place by synchronizing the communication with the pulse-width modulated frequency of the battery having a variable output voltage. Such an approach has several advantages, for example, the option of enabling a communication despite a temporarily interrupted transmission path. A powerline communication within a battery having a variable output voltage is also enabled without any additional switching effort. Such an approach may generally be used for all such batteries.

Another aspect of the present invention according to one exemplary embodiment enables the use of the battery (cell) housing in order to restore the transmission path from the side-branch to the evaluation device. A transmission path requires a DC circuit or, at least, a high-frequency closed circuit. This is not the case when side-branch 130*b* is decoupled; this side-branch may, however, be restored via a capacitive coupling of the sensor system to the battery housing, which is connected to the vehicle mass. This aspect of the present invention also has several advantages; for example, a communication within a battery having a variable output voltage is possible, in which individual cells or cell modules are decoupled. This aspect may also generally be used in all batteries having a variable output voltage.

The present invention may particularly advantageously be used as a device or configuration of a sensor system having electric and electronic components, which may be installed in or attached to a battery cell (for example, a lithium-ion battery of an electric vehicle.) The previously presented approach serves to exchange data between the sensor system and a central evaluation device, while individual battery cells are decoupled from the power supply line or bypassed due to the operating mode of the method used in the battery for generating a variable output voltage.

The exemplary embodiments described and shown in the Figures are selected only as examples. Different exemplary embodiments may be combined with each other completely or in regard to individual features. One exemplary embodiment may also be supplemented by features of another exemplary embodiment.

Furthermore, method steps according to the present invention may also be repeated or carried out in a sequence different from the sequence described.

If one exemplary embodiment includes an "and/or" link between a first feature and a second feature, this is to mean that the exemplary embodiment according to one specific embodiment includes both the first and the second feature, and according to another specific embodiment includes only the first feature or only the second feature.

What is claimed is:

1. A battery unit comprising:
    a battery cell assembly that includes a plurality of battery cells; and
    at least one sensor for providing a measured value that represents a physical variable one of in and at one of the plurality of battery cells;
    wherein each of the plurality of battery cells includes a battery sensor data transmission unit, the battery sensor data transmission unit including:

a data transmission unit for outputting a sensor signal that represents a physical variable one of in and at a battery cell of the battery unit; and a connection state ascertainment unit to determine a series connection state and/or a bypassing state in an electrical coupling or decoupling of the battery cells by measuring a current flowing over poles of the battery cell or an energy and/or power flowing over the poles, wherein the data transmission unit is coupled to the connection state ascertainment unit;

wherein the data transmission unit outputs the sensor signal to an evaluation device using at least one of a battery unit housing wall and a wall of the battery cell as a transmission medium, wherein the data transmission unit transmits the sensor signal to the battery unit housing wall using a capacitive coupling between the battery cell and the battery unit housing wall, wherein the battery sensor data transmission unit is electrically insulate-able from the battery unit housing wall, so that the sensor signal is transmittable even if there are differences in potential levels between the battery sensor data transmission unit and the battery unit housing wall, wherein the output of the sensor signal is synchronized to a power supply line and to the battery unit housing wall, wherein the battery sensor data transmission unit is configured to receive a signal from a connection control unit representing a switchover of a switch so that the battery sensor data transmission unit detects that it was switched to the bypassing state, without measuring a flow of power via the power supply line, to provide that the sensor signal is transmitted to the evaluation device, wherein to generate an alternating voltage at the output of the battery unit, certain ones of the plurality of battery cells or groups of the plurality of battery cells are bypassed in a series connection of the battery cells, so that the output voltage of the battery unit is variable as a sum of ones of the plurality of battery cells which are not bypassed, wherein, via the connection state ascertainment unit, the series connection state is determined in which one pole of a battery cell is connected in series to one pole of at least one other battery cell with the aid of the power supply line, and/or the bypassing state is determined in which the pole of the battery cell is not connected in series to the pole of the at least one other battery cell, wherein, via the data transmission unit, the sensor signal, which represents at least one physical variable in or at the battery cell, in the series connection state is configured to be output to the evaluation device using the power supply line, and the sensor signal is configured to be output in the bypassing state to the evaluation device by using the battery unit housing wall and/or the wall of the battery cell as the transmission medium, wherein the at least one physical variable includes at least one of a pressure and a temperature in or at the battery cell, and wherein to ensure a transmission of the sensor signal from the battery sensor data transmission unit of one of the battery cells that is decoupled from the power supply line or when the one of the battery cells is at least disconnected from a series circuit with the other ones of the battery cells, the battery sensor data transmission unit of the decoupled and/or disconnected battery cell is configured to close a high-frequency electrical circuit with the evaluation device, by establishing a connection which is capable of transmitting data, as a capacitive coupling, to the evaluation device via a wall of the decoupled and/or disconnected battery cell and/or the housing wall of the battery unit, and wherein the evaluation device is also connected to the housing wall of the battery unit via a capacitive coupling connection which is also capable of transmitting data.

2. The battery unit as recited in claim 1, wherein the data transmission unit transmits the sensor signal to the battery unit housing wall using an electrically conductive connection.

3. The battery unit as recited in claim 1, wherein the data transmission unit transmits the sensor signal using a code which is unambiguously assignable to the battery cell.

4. The battery unit as recited in claim 1, wherein the connection state ascertainment unit determines one of the series connection state and the bypassing state by evaluating a position of the switch that carries out an electrical coupling of a pole of the battery cell to the power supply line.

5. The battery unit as recited in claim 4, wherein the switch is activated using a control signal, and wherein the data transmission unit synchronizes one of an ascertainment and an output of the sensor signal with the control signal.

6. The battery unit as recited in claim 5, wherein the control signal includes a pulse-width modulated control signal.

7. The battery unit as recited in claim 1, wherein the connection state ascertainment unit ascertains one of the series connection state and the bypassing state using a measuring result relating to at least one of a current flow, an energy flow, and a power flow via the power supply line.

* * * * *